United States Patent
Zhang et al.

(10) Patent No.: US 10,103,348 B2
(45) Date of Patent: Oct. 16, 2018

(54) OLED, METHOD FOR MANUFACTURING THE SAME, AND OLED DISPLAY DEVICE

(71) Applicant: BOE TECHNOLOGY GROUP CO., LTD., Beijing (CN)

(72) Inventors: Can Zhang, Beijing (CN); Xue Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/534,523

(22) PCT Filed: Oct. 11, 2016

(86) PCT No.: PCT/CN2016/101747
§ 371 (c)(1),
(2) Date: Jun. 9, 2017

(87) PCT Pub. No.: WO2017/181620
PCT Pub. Date: Oct. 26, 2017

(65) Prior Publication Data
US 2018/0190933 A1    Jul. 5, 2018

(30) Foreign Application Priority Data
Apr. 22, 2016   (CN) .......................... 2016 1 0255474

(51) Int. Cl.
*H01L 51/52* (2006.01)
*H01L 51/56* (2006.01)
(Continued)

(52) U.S. Cl.
CPC ...... *H01L 51/5228* (2013.01); *H01L 51/0011* (2013.01); *H01L 51/5056* (2013.01);
(Continued)

(58) Field of Classification Search
CPC ...................... H01L 51/5228; H01L 2227/323
See application file for complete search history.

(56) References Cited

U.S. PATENT DOCUMENTS 8,530,910 B2    9/2013   Song et al.
9,287,339 B2    3/2016   Lee et al.
(Continued)

FOREIGN PATENT DOCUMENTS

CN          1471065 A      1/2004
CN        101083294 A     12/2007
(Continued)

OTHER PUBLICATIONS

Search Report for International Application No. PCT/CN2016/101747 dated Dec. 28, 2016.
(Continued)

*Primary Examiner* — Thomas L Dickey
(74) *Attorney, Agent, or Firm* — Calfee, Halter & Griswold LLP

(57) ABSTRACT

A method for manufacturing the OLED includes: forming an anode, a cathode layer and an intermediate layer; forming a patterned first organic material layer on the cathode layer; forming a patterned second organic material layer on the first organic material layer using a material different from that of the first organic material layer, wherein a projection of the first organic material layer in a direction perpendicular to a major plane of the OLED overlaps with a projection of the second organic material layer in the direction; and forming an auxiliary electrode on the cathode layer, wherein a projection of the auxiliary electrode in the direction perpendicular to the major plane of the OLED does not overlap with the projections of the first organic material layer and the second organic material layer in the direction.

20 Claims, 2 Drawing Sheets

(51) Int. Cl.
    *H01L 51/00*     (2006.01)
    *H01L 51/50*     (2006.01)

(52) U.S. Cl.
    CPC ...... *H01L 51/5072* (2013.01); *H01L 51/5206* (2013.01); *H01L 51/5234* (2013.01); *H01L 51/56* (2013.01)

(56) References Cited

U.S. PATENT DOCUMENTS

| | | |
|---|---|---|
| 2011/0175097 A1 | 7/2011 | Song et al. |
| 2012/0104422 A1 | 5/2012 | Lee et al. |
| 2016/0133680 A1 | 5/2016 | Lee et al. |
| 2016/0276619 A1* | 9/2016 | Cheng .................. H01L 51/56 |

FOREIGN PATENT DOCUMENTS

| | | |
|---|---|---|
| CN | 102456713 A | 5/2012 |
| CN | 103208590 A | 7/2013 |
| CN | 103219471 A | 7/2013 |
| CN | 104157675 A | 11/2014 |
| CN | 104766928 A | 7/2015 |
| CN | 105789479 A | 7/2016 |
| JP | 2008122956 A | 5/2008 |
| WO | 2007058603 A1 | 5/2007 |
| WO | 2013064941 A1 | 5/2013 |

OTHER PUBLICATIONS

First Office Action for Chinese Patent Application No. 201610255474.X dated Apr. 6, 2014.
Second Office Action for Chinese Patent Application No. 201610255474.X dated Apr. 22, 2016.

\* cited by examiner

OLED, METHOD FOR MANUFACTURING THE SAME, AND OLED DISPLAY DEVICE

CROSS REFERENCE

The present application is based upon International Application No. PCT/CN2016/101747, filed on Oct. 11, 2016, which is based upon and claims priority to Chinese Patent Application No. 201610255474.X, filed on Apr. 22, 2016, and the entire contents thereof are incorporated herein by reference.

TECHNICAL FIELD

Embodiments of the present disclosure relate to an organic light emitting diode (OLED), a method for manufacturing the same, and an OLED display device.

BACKGROUND

Current active organic light emitting diode (OLED) devices are typically controlled by thin film transistors (TFTs). Therefore, if an OLED device of the bottom emission structure emits light in the form of a bottom exit, the light emitted from the bottom is blocked by the TFTs and the metal wire circuits formed on the substrate when passing through the substrate, so that the area of the actual light emission is limited, resulting in a reduced ratio of light emitting area, which is the so-called aperture rate. In addition, in order to improve the brightness difference between pixels, many of the currently studied OLEDs employ pixel structures with compensation circuit in which pixel circuits such as 2T1C or higher are used. In this case, the aperture ratio of the OLED device of the bottom emission structure is further reduced. The top emitting OLED device has a great advantage over the bottom emitting OLED device, which increases the aperture ratio and extends the life of the device. For large-sized top emitting OLED devices, the cathode structure is critical.

Generally, the cathode of an OLED device may be prepared in two ways. In the first method with simpler process, a metal such as a magnesium-silver alloy is generally used as a cathode. However, due to the need for transparency, the metal needs to be formed to be very thin, which will result in a larger resistance, serious resistive voltage drop (IR drop), and poor uniformity of the OLED panel, which in turn affects the application of this process in large sized panels. In the second method, a transparent metal oxide such as indium zinc oxide (IZO) is used as the cathode. As the transparent metal oxide film material has a relatively high transparency, the resistance can meet the performance requirements of the device even when the thickness is large. However, since the transparent metal oxide material needs to be prepared by a sputtering process, the energy used at the time of sputtering is large, and the OLED device is liable to be damaged, thereby affecting the performances such as implantation efficiency and lifetime of the OLED device.

It should be noted that, information disclosed in the above background portion is provided only for better understanding of the background of the present disclosure, and thus it may contain information that does not form the prior art known by those ordinary skilled in the art.

SUMMARY

Embodiments of the present disclosure provide a novel OLED, a method for manufacturing the same, and an OLED display device.

According to a first aspect of the embodiment of the present disclosure, there is provided a method for manufacturing an OLED, the method comprising:

forming an anode, a cathode layer and an intermediate layer interposed between the anode and the cathode layer in a pixel defining layer;

forming a patterned first organic material layer on the cathode layer, the first organic material layer being formed in a pixel light emitting region of the OLED;

forming a patterned second organic material layer on the first organic material layer using a material different from that of the first organic material layer, wherein a projection of the first organic material layer in a direction perpendicular to a major plane of the OLED overlaps with a projection of the second organic material layer in the direction; and forming an auxiliary electrode on the cathode layer on which the patterned first organic material layer and the patterned second organic material layer are formed, wherein a projection of the auxiliary electrode in the direction perpendicular to the major plane of the OLED does not overlap with the projections of the first organic material layer and the second organic material layer in the direction.

According to a second aspect of the embodiment of the present disclosure, there is provided an OLED comprising:

an anode, a cathode layer and an intermediate layer interposed between the anode and the cathode layer in a pixel defining layer;

a patterned first organic material layer on the cathode layer, the first organic material layer being formed in a pixel light emitting region of the OLED;

a patterned second organic material layer on the first organic material layer, a material of the second organic material layer being different from that of the first organic material layer, wherein a projection of the first organic material layer in a direction perpendicular to a major plane of the OLED overlaps with a projection of the second organic material layer in the direction; and an auxiliary electrode on the cathode layer on which the patterned first organic material layer and the patterned second organic material layer are formed, wherein a projection of the auxiliary electrode in the direction perpendicular to the major plane of the OLED does not overlap with the projections of the first organic material layer and the second organic material layer in the direction.

According to a third aspect of the embodiment of the present disclosure, there is provided an organic light emitting diode (OLED) display device, comprising a plurality of OLEDs manufactured using the method according to the first aspect or the OLEDs according to the second aspect.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

In order to more clearly illustrate the technical solutions of the embodiments of the present disclosure, drawings of the embodiments of the present disclosure will be briefly described below. It will be apparent that the drawings in the following description refer only to some embodiments of the present disclosure, and are not intended to limit the present disclosure.

DETAILED DESCRIPTION

Figure 1:
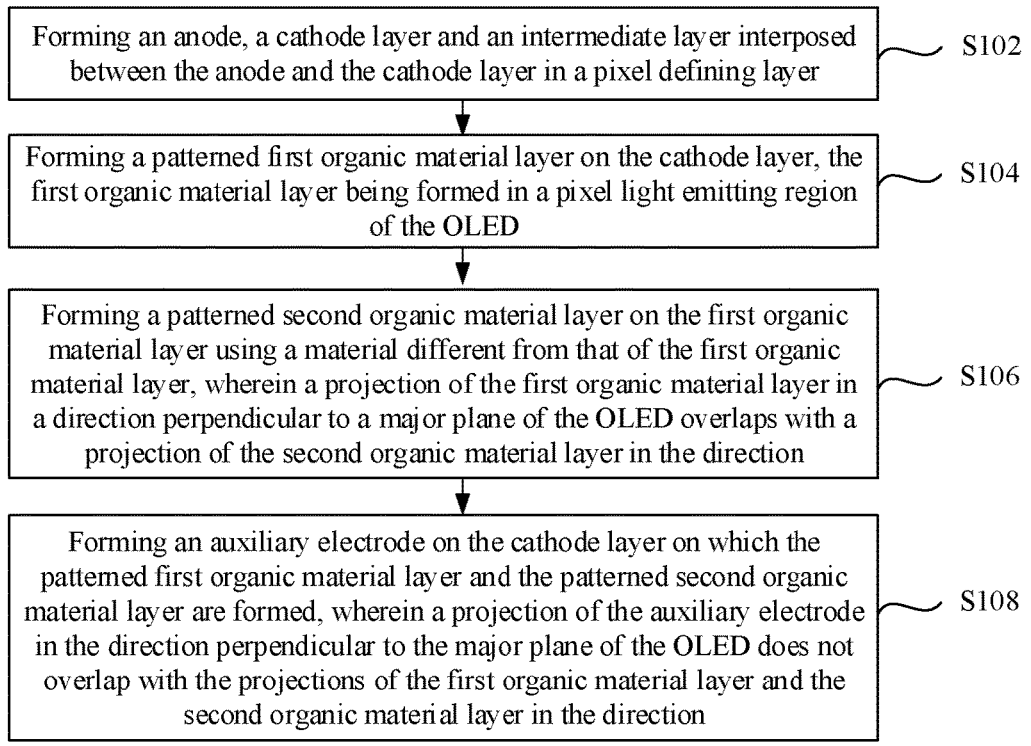
FIG. 1 is a flow chart of a method for manufacturing an OLED according to an embodiment of the present disclosure.

In order to make the objectives, technical solutions and advantages of the embodiments of the present disclosure more clear, the technical solutions of the embodiments of the present disclosure will be described clearly and completely in conjunction with the accompanying drawings of the embodiments of the present disclosure. It is obvious that the described embodiments are part of the embodiments rather than all embodiments of the present disclosure. All other embodiments obtained by one of ordinary skill in the art based on the described embodiments of the present disclosure without the need for creative work are within the scope of the present disclosure.

In the description of the embodiments of the present disclosure, it is to be noted that the directional or positional relationships indicated by the terms "upper", "lower", "top", "bottom" or the like are based on the directional or positional relationships shown in the drawings, which are provided only for the purpose of facilitating the description and simplification of the description and is not intended or implied that the device or element referred to must have a specific orientation, constructed or operated in a particular orientation. Accordingly, it should not be construed as a limitation of this disclosure.

In addition, in the description of the embodiments of the present disclosure, unless otherwise indicated, the term "a plurality of" means two or more.

According to exemplary embodiments of the present disclosure, an OLED and a method for manufacturing the same, and an OLED display device are provided.

FIG. 1 is a flow chart of a method for manufacturing an OLED according to an embodiment of the present disclosure. As illustrated in FIG. 1, the method for manufacturing the OLED comprises the steps that follow.

In step S102, an anode, a cathode layer and an intermediate layer interposed between the anode and the cathode layer are formed in a pixel defining layer.

In step S104, a patterned first organic material layer is formed on the cathode layer of the OLED, wherein the first organic material layer is formed in a pixel light emitting region of the OLED.

In step S106, a patterned second organic material layer is formed on the first organic material, wherein the second organic material layer is formed of a material different from that of the first organic material layer, and a projection of the first organic material layer in a direction perpendicular to a major plane of the OLED overlaps with a projection of the second organic material layer in said direction.

In step S108, an auxiliary electrode is formed on the cathode layer on which the patterned first organic material layer and the patterned second organic material layer are formed, wherein a projection of the auxiliary electrode in a direction perpendicular to a major plane of the OLED does not overlap with the projections of the first organic material layer and the second organic material layer in said direction.

Hereinafter, each step of the method for manufacturing the OLED and the resultant structure of each step will be described in detail with reference to FIG. 2 to FIG. 5.

Figure 2:
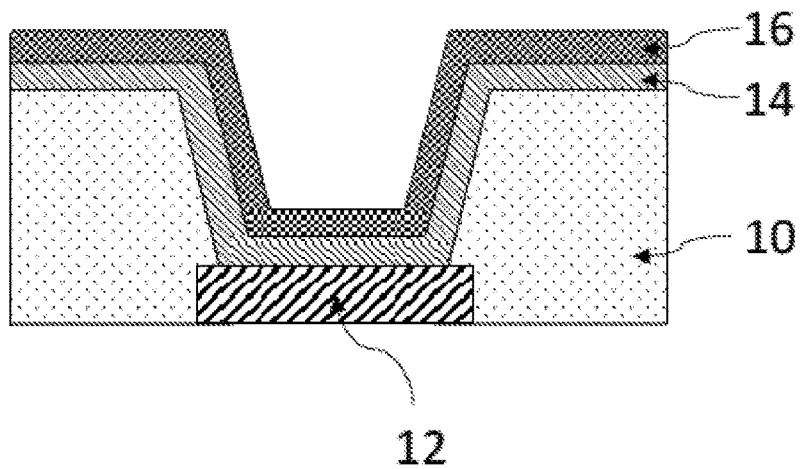
FIG. 2 is a schematic cross sectional view of the anode, the cathode layer and the intermediate layer forming the OLED according to an embodiment of the present disclosure.

As illustrated in FIG. 2, an anode 12, a cathode layer 16 and an intermediate layer 14 interposed between the anode 12 and the cathode layer 16 are formed in a pixel defining layer 10. The intermediate layer 14 may comprise organic layers such as a hole transport layer, an organic light emitting layer, an electron transport layer and the like.

Figure 3:
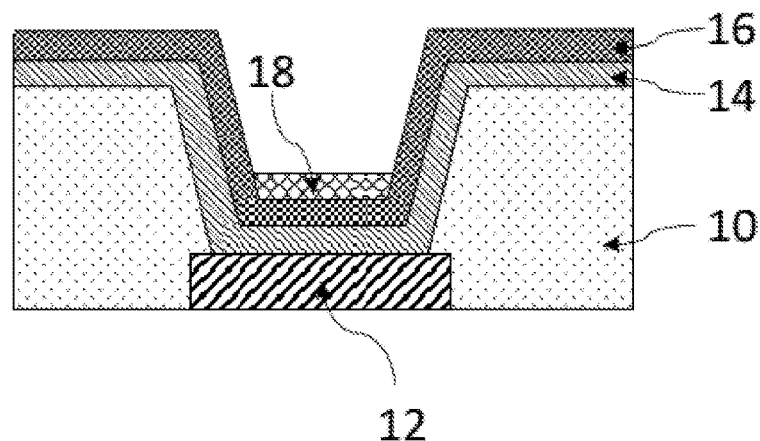
FIG. 3 is a schematic cross sectional view of forming the first organic material layer on the cathode layer of the OLED according to an embodiment of the present disclosure.

Next, a first organic material layer 18 that is patterned is formed on the cathode layer 16 of the OLED. The first organic material layer 18 is formed in a pixel light emitting region of the OLED, and the first organic material is not formed in other regions of the OLED. During this period, the resulted structure is illustrated in FIG. 3.

The first organic material layer 18 may be formed by vapor depositing using a mask. In an exemplary embodiment of the present disclosure, the first organic material layer 18 may be vapor deposited on the cathode layer 16 using a fine metal mask (FMM), thereby improving the fineness and positioning accuracy of the pattern of first organic material layer 18 and effectively forming the first organic material layer 18 in the pixel light emitting region of the OLED.

The first organic material layer 18 may function as a light extracting layer. The light extracting layer is also referred to as a cathode cladding layer. The light extracting layer may have a thickness of $\lambda/4n$, wherein $\lambda$ is a peak wavelength of the emitted light, and n is a refractive index of the light extracting layer. The transmittance of the light extracting layer increases as the refractive index of the light extracting layer increases. However, on the other hand, the microcavity effect decreases as the transmittance of the light extracting layer increases. Accordingly, one of the requirements for the light extracting layer is the refractive index matching, which is compromised between the transmittance and the microcavity effect, and such a light extracting layer may improve the efficiency of the device. According to an exemplary embodiment, the light extracting layer may comprise an organic small molecular material having a relative higher refractive index (e.g., a refractive index greater than or equal to 1.8). For example, the light extracting layer may comprise Alq3.

Figure 4:
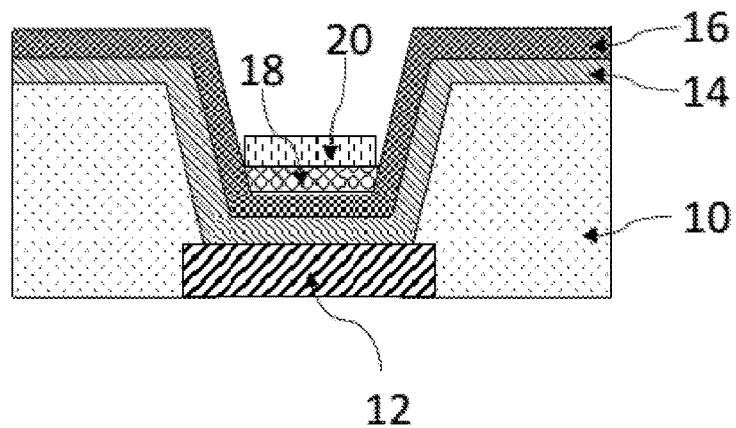
FIG. 4 is a schematic cross sectional view of forming the second organic material layer on the first organic material layer according to an embodiment of the present disclosure.

Next, as illustrated in FIG. 4, the patterned second organic material layer 20 is formed on the first organic material layer 18. The second organic material layer 20 comprises a material different from that of the first organic material layer 18. In addition, a projection of the first organic material layer 18 in the direction perpendicular to the major plane of the OLED overlaps with that of the second organic material layer 20 in said direction. In an exemplary embodiment, the second organic material layer 20 may comprise an organic material that is attachable to the material of the first organic material layer 18 but is not attachable to the material of the cathode layer 16. Accordingly, the second organic material layer 20 and the first organic material layer 18 may be automatically aligned in the direction perpendicular to the major surface of the OLED.

In this embodiment, it should be noted that if one material is described herein to be "attachable" to another material, it means that there is a sticking property between the two materials. On the other hand, if one material is described herein to be "not attachable" to another material, it means that there is no sticking property between the two materials, or there is a non-sticking property between the two materials.

As illustrated in FIG. 4, since the second organic material layer 20 and the first organic material layer 18 are automatically aligned, the second organic material layer 20 is also formed in the pixel light emitting region of the OLED.

In an exemplary embodiment, the patterned second organic material layer 20 may also be formed on the first organic material layer 18 using the FMM, thereby improving the fineness and positioning accuracy of the pattern of second organic material layer 20 and effectively forming the second organic material layer 20 in the light emitting region of the OLED.

In another exemplary embodiment, the second organic material layer 20 is formed by a material that is attachable to the material of the first organic material layer 18 but is not attachable to the material of the cathode layer 16, i.e., the second organic material layer 20 and the first organic material layer 18 may be automatically aligned. Accordingly, it is possible to vapor deposit the second organic material layer 20 using an opened mask. In this case, since the fabrication of the opened mask itself is simple and easy, and the use of the opened mask for vapor deposition does not require high precision alignment as with the FMM, the manufacturing process is relatively simple and the manufacturing cost is low.

The second organic material layer 20 may comprise any material that is attachable to the organic material while not attachable to the cathode metal. In an exemplary embodiment, the second organic material layer 20 may comprise a small molecular silicone material, such as isocyanate-based silane, alkoxy silicon polyurethane, and the like. The small molecular silicone material has a good non-sticking property to the material of the auxiliary electrode that is to be formed on the cathode layer 16, thereby improving the positioning accuracy of the auxiliary electrode.

Figure 5:
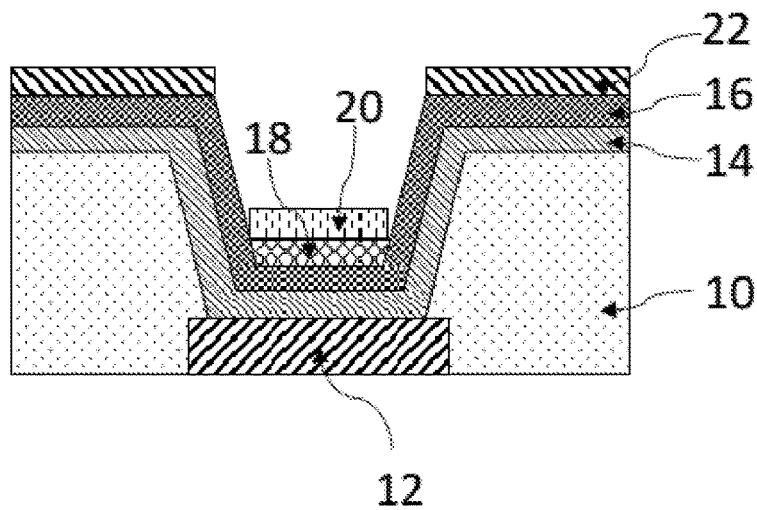
FIG. 5 is a schematic cross sectional view of forming the auxiliary electrode on the cathode layer on which the first and second organic material layers are formed according to an embodiment of the present disclosure.

Next, as illustrated in FIG. 5, the auxiliary electrode 22 is formed on the cathode layer 16 on which the patterned first and second organic material layers 18 and 20 are formed, wherein the projection of the auxiliary electrode 22 in the direction perpendicular to the major plane of the OLED does not overlap with the projections of the first organic material layer 18 and the second organic material layer 20 in the direction. In an exemplary embodiment, the auxiliary electrode 22 may comprise a material that is not attachable to the material of the second organic material layer 20 while is attachable to the material of the cathode layer 16, such that the auxiliary electrode 22 is positioned on the cathode layer 16 outside the pixel light emitting region.

In an exemplary embodiment, the material of the auxiliary electrode may be vapor deposited using an opened mask on the cathode layer 16 on which the first organic material layer 18 and the second organic material layer 20 are formed. Since the material of the auxiliary electrode 22 is attachable to the material of the cathode layer 16 while is not attachable to the material of the second organic material layer 20, it is possible to simply use an opened mask to form the auxiliary electrode 22 on the cathode layer 16 in a region outside the first organic material layer 18 and the second organic material layer 20, that is, the region of the cathode layer 16 outside the pixel light emitting region.

The auxiliary electrode 22 may comprise any material that is able to be used as an electrode. Preferably, Ag, Al and the alloy containing at least one of Ag and Al may have a lower deposition temperature, which is easily implementable during the manufacturing process. Accordingly, it is possible to reduce the manufacturing difficulty and cost by forming the auxiliary electrode using Ag, Al or the alloy thereof.

According to an embodiment of the present disclosure, it is also possible to expect an OLED display device comprising a plurality of the above OLEDs.

Exemplary embodiments of the present disclosure are described hereinabove. The first and second organic materials are formed on the cathode layer of the OLED within the pixel light emitting region, and due to the properties of the second organic material, the second organic material may be well attached to the first organic material, while metal material will not be attached to the second organic material. Accordingly, the fine auxiliary electrode may be formed outside the pixel light emitting region, such that the auxiliary electrode may be connected to the cathode layer without affecting the light exiting from the pixel light emitting region, thereby effectively reducing the IR drop of the OLED and improving the uniformity of the OLED panel.

In the description of the present disclosure, various specific details have been described. However, it will be appreciated that embodiments of the present disclosure may be implemented without these specific details. In some embodiment, known methods, structures and technologies are not illustrated in detail so as not to obscure the understanding of the specification.

It should be noted that the above embodiments are merely illustrative of the technical solutions of the present disclosure and are not to be construed as limiting the present disclosure. Although the present disclosure has been described in detail with reference to the foregoing embodiments, one of ordinary skill in the art will understand that various modifications, combinations, or equivalents of some of the technical features described therein are possible to the technical solutions according to the above embodiments, all without departing from the spirit and scope of the embodiments of the present disclosure.

What is claimed is:

1. A method for manufacturing an organic light emitting diode (OLED), comprising:
   forming an anode, a cathode layer and an intermediate layer interposed between the anode and the cathode layer in a pixel defining layer;
   forming a patterned first organic material layer on the cathode layer, the first organic material layer being formed in a pixel light emitting region of the OLED;
   forming a patterned second organic material layer on the first organic material layer using a material different from that of the first organic material layer, wherein a projection of the first organic material layer in a direction perpendicular to a major plane of the OLED overlaps with a projection of the second organic material layer in the direction; and
   forming an auxiliary electrode on the cathode layer on which the patterned first organic material layer and the patterned second organic material layer are formed, wherein a projection of the auxiliary electrode in the direction perpendicular to the major plane of the OLED does not overlap with the projections of the first organic material layer and the second organic material layer in the direction.

2. The method according to claim 1, wherein the step of forming a patterned first organic material layer on the cathode layer comprises: vapor depositing the first organic material layer on the cathode layer using a fine metal mask.

3. The method according to claim 1, wherein the step of forming a patterned second organic material layer on the first organic material layer comprises: vapor depositing the second organic material layer on the first organic material layer using a fine metal mask or an opened mask.

4. The method according to claim 1, wherein the step of forming an auxiliary electrode on the cathode layer on which the patterned first organic material layer and the patterned second organic material layer are formed comprises: vapor depositing a material for the auxiliary electrode on the cathode layer on which the patterned first organic material layer and the patterned second organic material layer are formed using an opened mask.

5. The method according to claim 1, wherein the first organic material layer comprises an organic small molecular material having a refractive index greater than or equal to 1.8.

6. The method according to claim 1, wherein the second organic material layer comprises a small molecular silicone material.

7. The method according to claim 1, wherein the auxiliary electrode comprises Ag, Al or an alloy containing at least one of Ag and Al.

8. The method according to claim 1, wherein the second organic material layer is formed of an organic material that is attachable to a material of the first organic material layer while is not attachable to a material of the cathode layer.

9. The method according to claim 1, wherein the auxiliary electrode is formed of a material that is not attachable to a material of the second organic material layer while is attachable to a material of the cathode layer.

10. An organic light emitting diode (OLED) comprising:
an anode, a cathode layer and an intermediate layer interposed between the anode and the cathode layer in a pixel defining layer;
a patterned first organic material layer on the cathode layer, the first organic material layer being formed in a pixel light emitting region of the OLED;
a patterned second organic material layer on the first organic material layer, a material of the second organic material layer being different from that of the first organic material layer, wherein a projection of the first organic material layer in a direction perpendicular to a major plane of the OLED overlaps with a projection of the second organic material layer in the direction; and
an auxiliary electrode on the cathode layer on which the patterned first organic material layer and the patterned second organic material layer are formed, wherein a projection of the auxiliary electrode in the direction perpendicular to the major plane of the OLED does not overlap with the projections of the first organic material layer and the second organic material layer in the direction.

11. The OLED according to claim 10, wherein the first organic material layer comprises an organic small molecular material having a refractive index greater than or equal to 1.8.

12. The OLED according to claim 10, wherein the second organic material layer comprises a small molecular silicone material.

13. The OLED according to claim 10, wherein the auxiliary electrode comprises Ag, Al or an alloy containing at least one of Ag and Al.

14. The OLED according to claim 10, wherein the second organic material layer comprises an organic material that is attachable to a material of the first organic material layer while is not attachable to a material of the cathode layer.

15. The OLED according to claim 10, wherein the auxiliary electrode comprises a material that is not attachable to a material of the second organic material layer while is attachable to a material of the cathode layer.

16. An organic light emitting diode (OLED) display device, comprising an OLED, wherein the OLED comprises:
an anode, a cathode layer and an intermediate layer interposed between the anode and the cathode layer in a pixel defining layer;
a patterned first organic material layer on the cathode layer, the first organic material layer being formed in a pixel light emitting region of the OLED;
a patterned second organic material layer on the first organic material layer, a material of the second organic material layer being different from that of the first organic material layer, wherein a projection of the first organic material layer in a direction perpendicular to a major plane of the OLED overlaps with a projection of the second organic material layer in the direction; and
an auxiliary electrode on the cathode layer on which the patterned first organic material layer and the patterned second organic material layer are formed, wherein a projection of the auxiliary electrode in the direction perpendicular to the major plane of the OLED does not overlap with the projections of the first organic material layer and the second organic material layer in the direction.

17. The OLED display device according to claim 16, wherein the first organic material layer comprises an organic small molecular material having a refractive index greater than or equal to 1.8.

18. The OLED display device according to claim 16, wherein the second organic material layer comprises a small molecular silicone material.

19. The OLED display device according to claim 16, wherein the auxiliary electrode comprises a material that is not attachable to a material of the second organic material layer while is attachable to a material of the cathode layer.

20. The OLED display device according to claim 16, the second organic material layer comprises an organic material that is attachable to a material of the first organic material layer while is not attachable to a material of the cathode layer.

* * * * *